(12) United States Patent
Englekirk

(10) Patent No.: US 9,768,773 B2
(45) Date of Patent: Sep. 19, 2017

(54) DUAL VOLTAGE SUPPLY

(71) Applicant: Peregrine Semiconductor Corporation, San Diego, CA (US)

(72) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/007,847

(22) Filed: Jan. 27, 2016

(65) Prior Publication Data

US 2017/0214402 A1 Jul. 27, 2017

(51) Int. Cl.
H03K 19/094 (2006.01)
H03K 19/00 (2006.01)
H01C 1/16 (2006.01)
H03F 3/45 (2006.01)

(52) U.S. Cl.
CPC .......... H03K 19/0002 (2013.01); H01C 1/16 (2013.01); H03F 3/45 (2013.01)

(58) Field of Classification Search
CPC ......... H03K 19/00315; H03K 19/0826; H03K 19/09429
USPC ...................................... 326/56–58
See application file for complete search history.

(56) References Cited

U.S. PATENT DOCUMENTS

| 6,046,627 A * | 4/2000 | Itoh ........................ G11C 5/146 257/E27.062 |
| 7,382,178 B2 * | 6/2008 | Caplan ............... H03K 19/0013 327/536 |
| 2004/0232946 A1 * | 11/2004 | Koo .................. H03K 19/00315 326/81 |

* cited by examiner

*Primary Examiner* — Jason M Crawford
(74) *Attorney, Agent, or Firm* — Jaquez Land Greenhaus LLP; Martin J. Jaquez, Esq.; Alessandro Steinfl, Esq.

(57) ABSTRACT

A system, comprising a dual voltage supply configured to receive a logic state input voltage and configured to output an output voltage, wherein the dual voltage supply is configured to output a nominal voltage at a high state of the logic state input voltage and the dual voltage supply is configured to output a high voltage at a low state of the logic state input voltage, a pre-charge capacitor is configured to receive the output voltage of the dual voltage supply and an output buffer has an output buffer power input is coupled to the pre-charge capacitor and configured to receive the output voltage of the dual voltage supply, an output buffer signal input is configured to receive the logic state input voltage and an output buffer output is configured to output a digital output signal.

30 Claims, 15 Drawing Sheets

DUAL VOLTAGE SUPPLY

BACKGROUND (1) Technical Field

The present disclosure is widely applicable to electronic integrated circuits (ICs). Specifically a dual voltage supply driving a output buffer.

(2) Background

When a digital supply is not available to power a digital output buffer, a supply is created from whatever supplies exist on-chip. In low power applications, this regulator generally has fairly poor bandwidth and slow response to changes in loading. Thus it is common to use large storage capacitors to stabilize the output voltage. These large capacitors may be large while still allowing voltage droop problems under extreme loading which may lead to slow rise times from the output buffer.

Therefore, regulating the supply voltage of a buffer by using a dual voltage supply may provide a solution to the slow rise times from the output buffer while reducing size.

SUMMARY OF THE INVENTION

In one embodiment, a system, comprising a dual voltage supply configured to receive a logic state input voltage and configured to output an output voltage, wherein the dual voltage supply is configured to output a nominal voltage at a high state of the logic state input voltage and the dual voltage supply is configured to output a high voltage at a low state of the logic state input voltage, a pre-charge capacitor configured to receive the output voltage of the dual voltage supply and an output buffer has an output buffer power input coupled to the pre-charge capacitor and configured to receive the output voltage of the dual voltage supply, an output buffer signal input configured to receive the logic state input voltage and an output buffer output configured to output a digital output signal.

In another embodiment, a system comprising at least three voltage dividing resistors coupled in series, a voltage divider switch coupled across at least one of the at least three voltage dividing resistors and configured to receive a logic state input voltage, a differential amplifier has a first differential amplifier input coupled to at least one of the at least three voltage dividing resistor and a second differential amplifier input configured to receive a reference voltage, a power gating transistor has a power gating gate coupled to a differential amplifier output of the differential amplifier, a power gating drain configured to be coupled to a power source and a power gating source coupled to one of the at least three voltage dividing resistors, a pre-charge capacitor coupled to the power gating source of the power gating transistor and an output buffer configured to receive power from the source of the power gating transistor and the pre-charge capacitor, an output buffer signal input configured to receive the logic state input voltage and an output buffer signal output configured to output a digital output signal. Depending upon the device type and circuit layout the power gating transistor and the voltage divider switch source and drain may be interchangeable.

In a further embodiment, a system comprising a third resistor, a power gating transistor has a power gating drain configured to be coupled to a power source and a power gating source coupled to the third resistor, a pull up transistor has a pull up gate configured to receive a logic state input voltage, a pull up source coupled to a first end of the third resistor, a differential amplifier has a first input coupled to a reference voltage and a differential amplifier output coupled to a power gating gate of the power gating transistor and an output buffer has an input buffer power input configured to receive the output voltage, an output buffer signal input configured to receive the logic state input voltage and an output buffer signal output configured to output a digital output signal. Depending upon the device type and circuit layout the power gating transistor and the pull up transistor source and drain may be interchangeable.

In yet a another embodiment, a method comprising establishing a digital output buffer having a buffer input, a buffer output and a buffer power connection, pre-charging a pre-charge capacitor coupled to the buffer power connection to one of a high state upon receiving a low logic state input voltage at the buffer input and a nominal state upon receiving a high logic state input voltage at the buffer input and utilizing the charge stored on the pre-charge capacitor to drive the buffer output.

In yet a further embodiment, a method comprising establishing a digital output buffer having a buffer input, a buffer output and a buffer power connection, selecting at least one sense resistor from a sense resistor network to set a threshold of a high and low sense signal, pre-charging a pre-charge capacitor coupled to the buffer power connection based on the sense signal and utilizing the charge stored on the pre-charge capacitor to drive the buffer output.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

A circuit is disclosed which supplies output buffers with their own supply regulator. The regulator has two voltage output settings: nominal (1.8V) and high (2V). When the output buffer is tasked with outputting a low (e.g. 0V), the regulator is set to a high voltage pre-charge state. When the output buffer is set to a high state and the load capacitance has to be charged to 1.8V, the charge on the storage capacitor above the voltage that is to be utilized may be dissipated to create crisp rising edges because the output supply does not dip below the target output high voltage. Tuning of storage capacitors to an output buffer load capacitance results in sharper waveforms. In initial simulations with the disclosed circuit having a 15 pF load on the output buffer, only 100 pF of storage capacitance is required to generate sharp waveforms. Without the pre-charge function, the storage capacitor may have to be four times larger for similar results.

Figure 1:
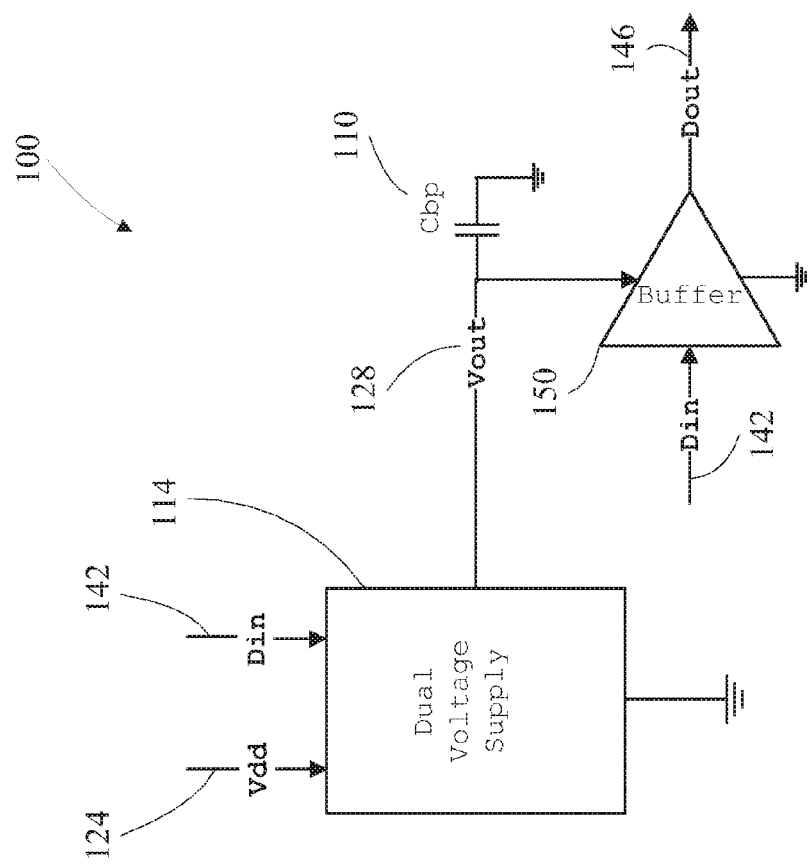
FIG. 1 is a dual voltage supply and a buffer in accordance with one embodiment of the disclosure.

FIG. 1 depicts an overview of the dual voltage supply and digital output buffer. A dual voltage supply 114 receives an upcoming state as the logic state input voltage 142 (Din) and a power input 124 (Vdd). The logic state input voltage Din indicates whether a high or low state is next for outputting.

The dual voltage supply 114 is configured to output an output voltage (Vout) 128, has a nominal voltage at a high state of an output buffer to output a high voltage at a low state of the output buffer.

A pre-charge capacitor 110 (Cbp) is used to drive a buffer, which in turn drives an output load (not shown). The pre-charge capacitor is a charge storage vehicle to hold enough charge to drive the output load through a digital output buffer 150 without allowing the output voltage to droop. The pre-charge capacitor assists in driving the load quickly for initial charge requirements of the output circuit. In this example, with the output voltage 128 (Vout) continuously charging the pre-charge capacitor, the size of the capacitor is significantly reduced.

The digital output buffer 150 has an input configured to receive a logic state input voltage (Din) 142 indicating the upcoming state of the data. The digital output buffer 150 power input is the output voltage signal (Vout) 128 and the digital output buffer outputs a digital output signal 146 (Dout).

Figure 2:
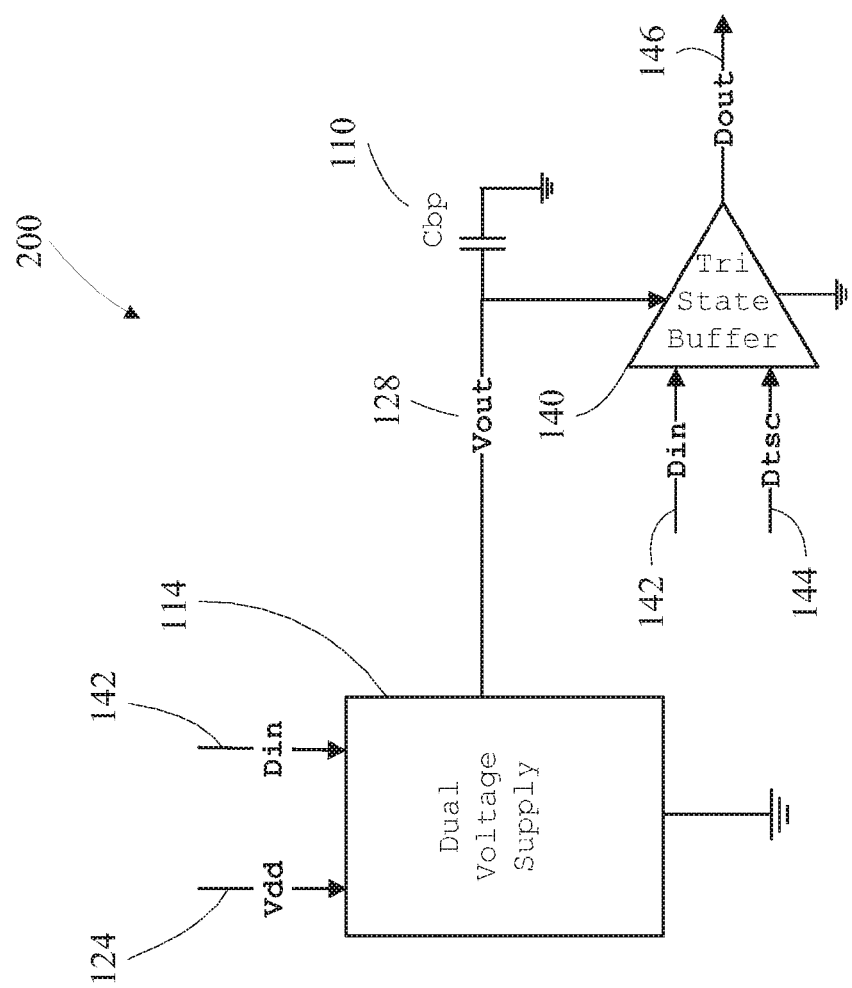
FIG. 2 is a dual voltage supply and a tristate buffer in accordance with one embodiment of the disclosure.

FIG. 2 is a modification of the circuit of FIG. 1 in which a digital output buffer 140 is coupled to the dual voltage supply 114 and is configured to receive the logic state input voltage 142 (Din) indicating the upcoming state of the data. The digital output buffer in this example is a tri-state buffer, has the logic state input voltage 142 (Din) as an input and an optional tristate control signal 144 (Dtsc) that may disable output for bi-directional use. The digital output buffer 140 has as a power input the output voltage signal (Vout) 128 from the dual voltage supply 114 assisted by the pre-charge capacitor 110 and outputs a digital output 146 (Dout). The signal 142 (Din) is received on-chip and the signal 146 (Dout) is ported off-chip to drive an off-chip load. The output buffer has an output buffer signal input, an output buffer signal output and an output buffer power input. In the case of tristate buffers, a second input is found, that of the tristate control signal input, which disables the output for bi-directional use.

The dual voltage supply receives an input from the buffer indicating the upcoming state of the data. The dual voltage supply provides at least two functions, swinging the output from low to high and alerting the remainder of the circuit to provide it with either a nominal or high voltage based on the upcoming state of the data. If the upcoming data to be output is high, the requested voltage is nominal, if the upcoming data to be output is low, the requested voltage is high. In this way, the system is ready for the next output bit.

Figure 3:
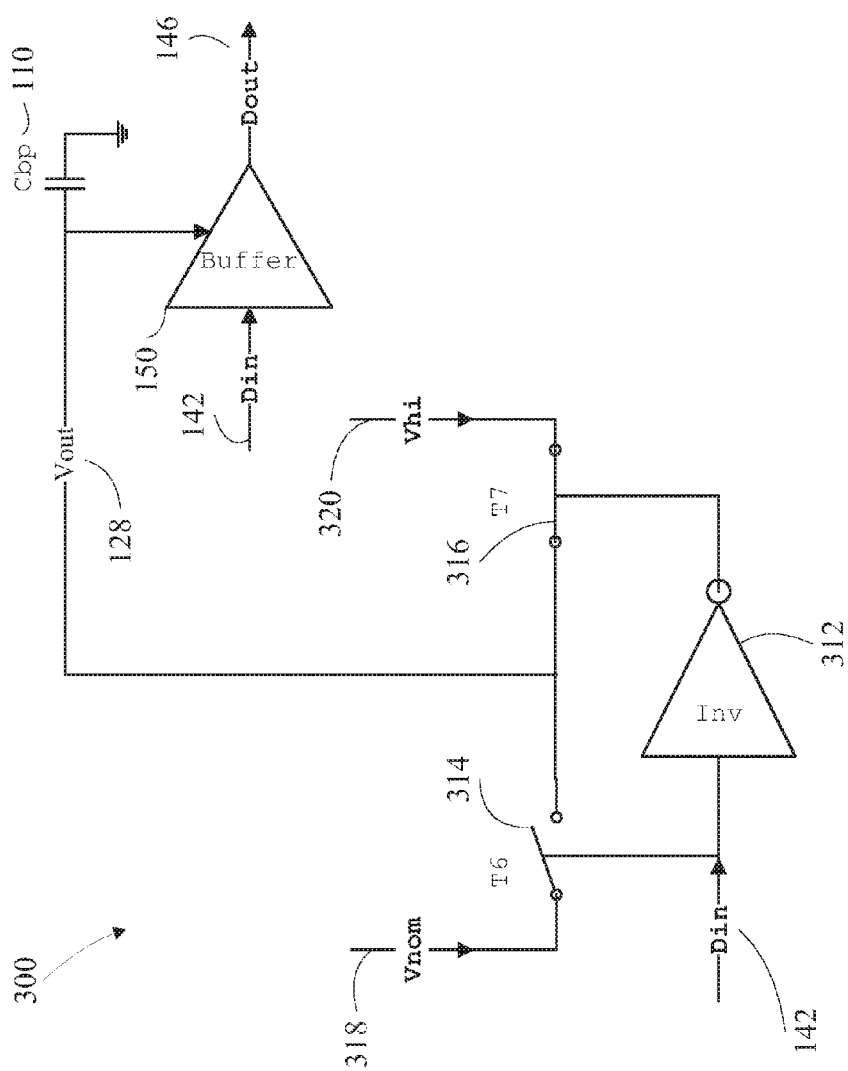
FIG. 3 is a simplified dual voltage supply utilizing switches and a buffer in accordance with one embodiment of the disclosure.

FIG. 3 depicts a simplified dual voltage supply that has an inverter 312 that is configured to receive the logic state input voltage 142 (Din), a nominal switch 314 (T6) has a nominal switch actuator coupled to an input of the inverter 312. The nominal switch 314 (T6) is configured to receive a nominal voltage 318 (Vnom) at a nominal switch first pole. A high switch 316 (T7) has a high switch actuator coupled to an inverter output of the inverter 312. The high switch 316 (T7) is configured to receive a high voltage 320 (Vhi) at the high voltage first pole. A high switch second pole is coupled to a nominal switch second pole and the output buffer 150 has an output buffer power input coupled to a junction of the nominal switch 314 (T6) and the high switch 316 (T7) and coupled to the pre-charge capacitor 110 (Cbp) which stores energy supplied by the output voltage 128 (Vout). In this example the nominal voltage 318 (Vnom) and the high voltage 320 (Vhi) are shown as inputs, this is due to the fact that there are multiple ways of providing two voltages, as example by a resistor string, a bias transistor and the like. The inputs to the nominal voltage 318 and the high voltage 320 may be either connected as shown at both inputs or switched from input to input. Depending upon bias transistor type and circuit layout the bias transistor source and drain may be interchangeable and the inverter may be removed from the circuit.

Figure 4:
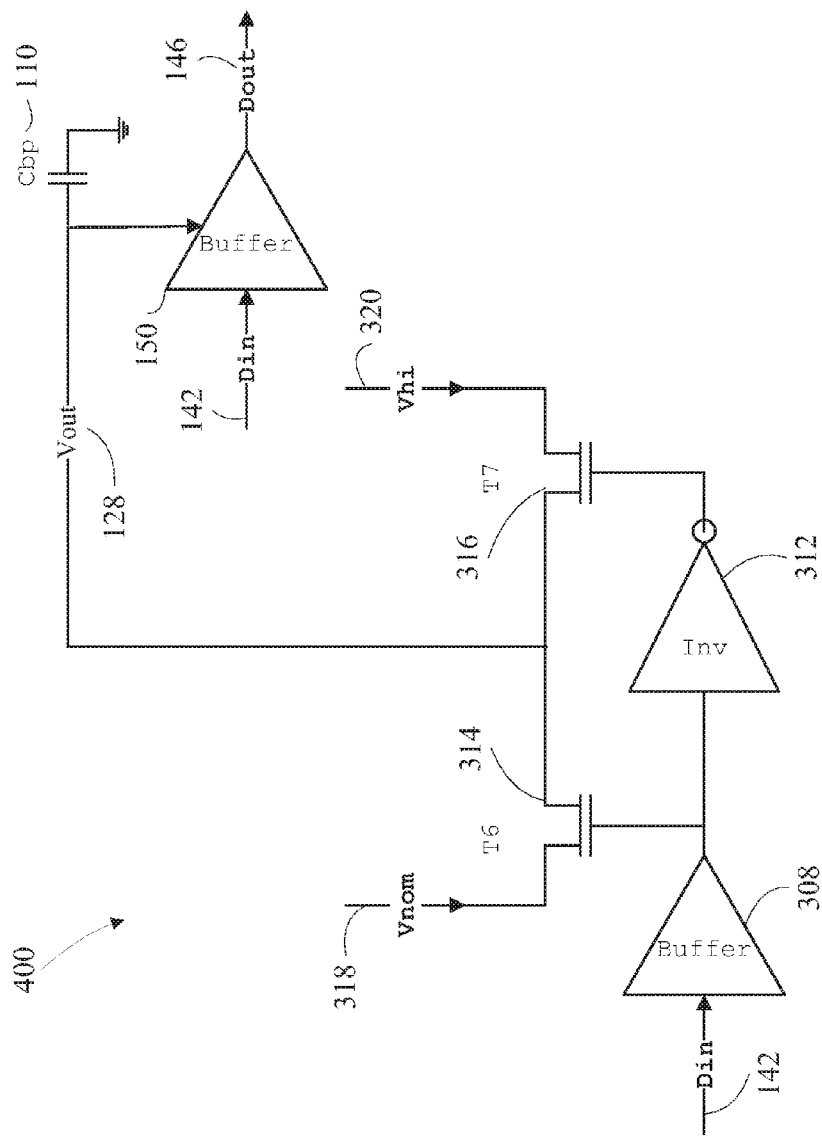
FIG. 4 is a simplified dual voltage supply utilizing transistors and a buffer in accordance with one embodiment of the disclosure.

FIG. 4 depicts an input buffer 308 that is configured to receive the logic state input voltage 142 (Din). A nominal transistor 314 (T6) has a nominal transistor gate is coupled to an output of the input buffer 308. A nominal transistor drain is configured to receive a nominal voltage 318 (Vnom). An inverter 312 has an inverter input is coupled to the input buffer output. A high transistor 316 (T7) has a high transistor gate is coupled to an inverter output of the inverter 312. A high transistor drain is configured to receive a high voltage 320 (Vhi). A high transistor source is coupled to a nominal transistor source of the nominal transistor 314 (T6) and the output buffer 150 has an output buffer power input coupled to the nominal transistor drain of the nominal transistor 314 (T6) and to the pre-charge capacitor 110 (Cbp). In this example the nominal transistor and the high transistor are n-type. Other arrangements of the circuit allow multiple design options where either the nominal transistor and/or the high transistor may be p-type. Depending upon nominal transistor and high transistor type and circuit layout the sources and drains may be interchangeable and the inverter may be removed from the circuit.

Figure 5:
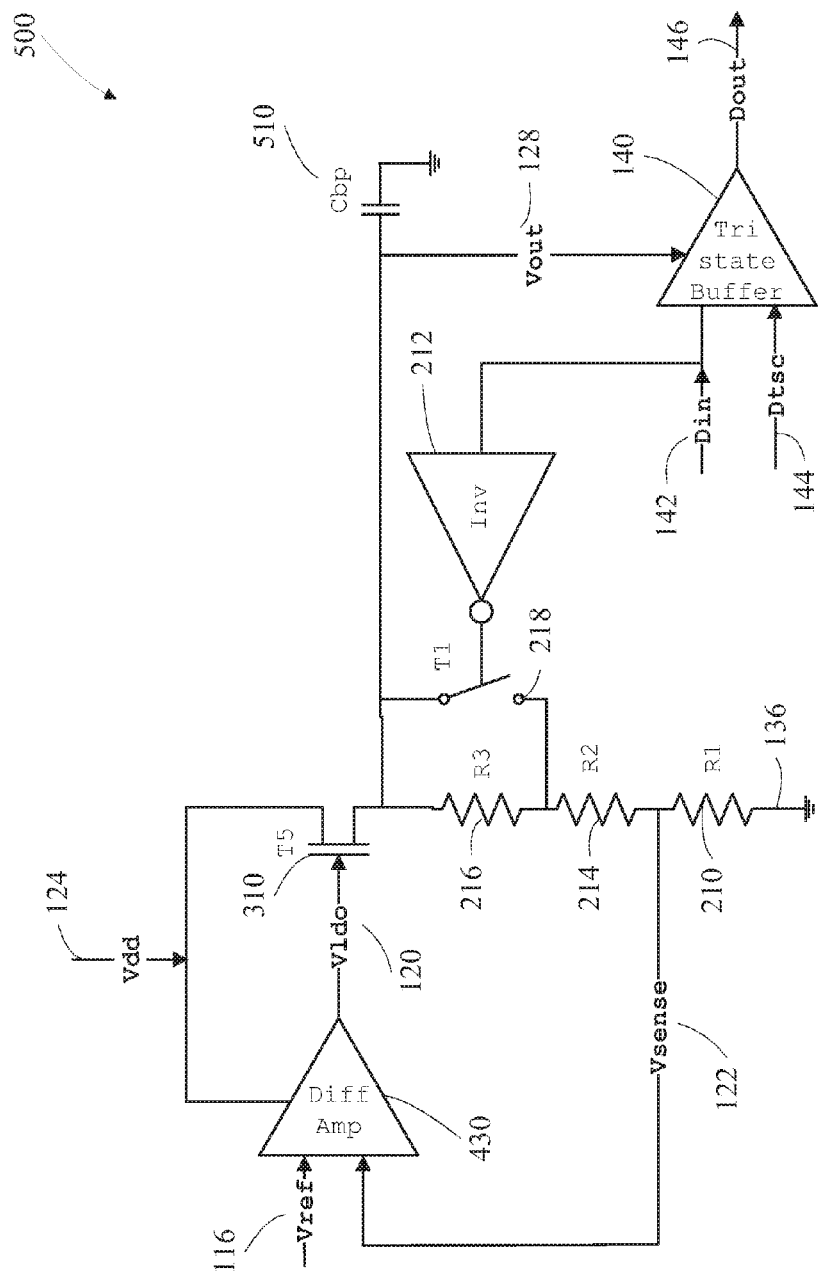
FIG. 5 is a dual voltage supply utilizing a switch and buffer in accordance with one embodiment of the disclosure.

FIG. 5 depicts an example of the system in which a first resistor (R1) 210, a second resistor (R2) 214 in series connection with the first resistor (R1) 210 and a third resistor (R3) 216 in series connection to the second resistor (R2) 214. At the junction of the first resistor (R1) 210 and R2 (214) a voltage divided output voltage where the sense voltage (Vsense) 122 is tapped.

Resistors (R1), (R2) and (R3) act as a set of voltage dividers, such that (Vsense) 122 outputs a lower voltage signal that is one of the inputs to the differential amplifier.

A differential amplifier 430 receives two signals: the voltage divided output voltage sense voltage (Vsense) 122 and a reference voltage 116 (Vref) and outputs a low voltage dropout signal 120 (Vldo).

A power gating transistor 310 (T5) used as a voltage gate. The drain of the power gating transistor is coupled to power source 124 (Vdd) and has a source outputting the output voltage 128 (Vout). The gate of the power gating transistor is configured to receive the low voltage dropout signal (Vldo) 120 from the differential amplifier.

An inverter 212 has an output coupled to the gate of the pull up switch (T1) 218. The inverter power input is derived from the output voltage signal (Vout) 128 and has an input the logic state input voltage 142 (Din). The inverter 212 may be replaced with a buffer or the like. The power gating transistor (T5) 310 and pull up switch (T1) 218 may be n-type or p-type depending upon the particular circuit design as is understood by those skilled in the art.

Pull up switch (T1) 218 acts as a bridge across resistor (R3) 216 which changes the apparent resistance, current flow and thus voltage output at Vsense 122, which effects the differential amplifier, which in turn effects Vldo to cause a change in the output voltage Vout 128 driven by the power gating transistor (T5).

The gate of the pull up switch (T1) 218 is driven by the output of inverter 212, the input of inverter 212 is configured to receive a logic state input voltage (Din) 142.

A digital output buffer 140 is coupled to the input of inverter 212 and is configured to receive the logic state input voltage 142 (Din) indicating the upcoming state of the data. The digital output buffer in this example is a tri-state buffer having the logic state input voltage 142 (Din) as an input and a tristate control signal 144 (Dtsc) to disable the output for bi-directional use. The digital output buffer 140 power input is the output voltage signal (Vout) 128 and the pre-charge capacitor 110 (Cbp), and the digital output buffer outputs a digital output signal 146 (Dout).

Figure 6:
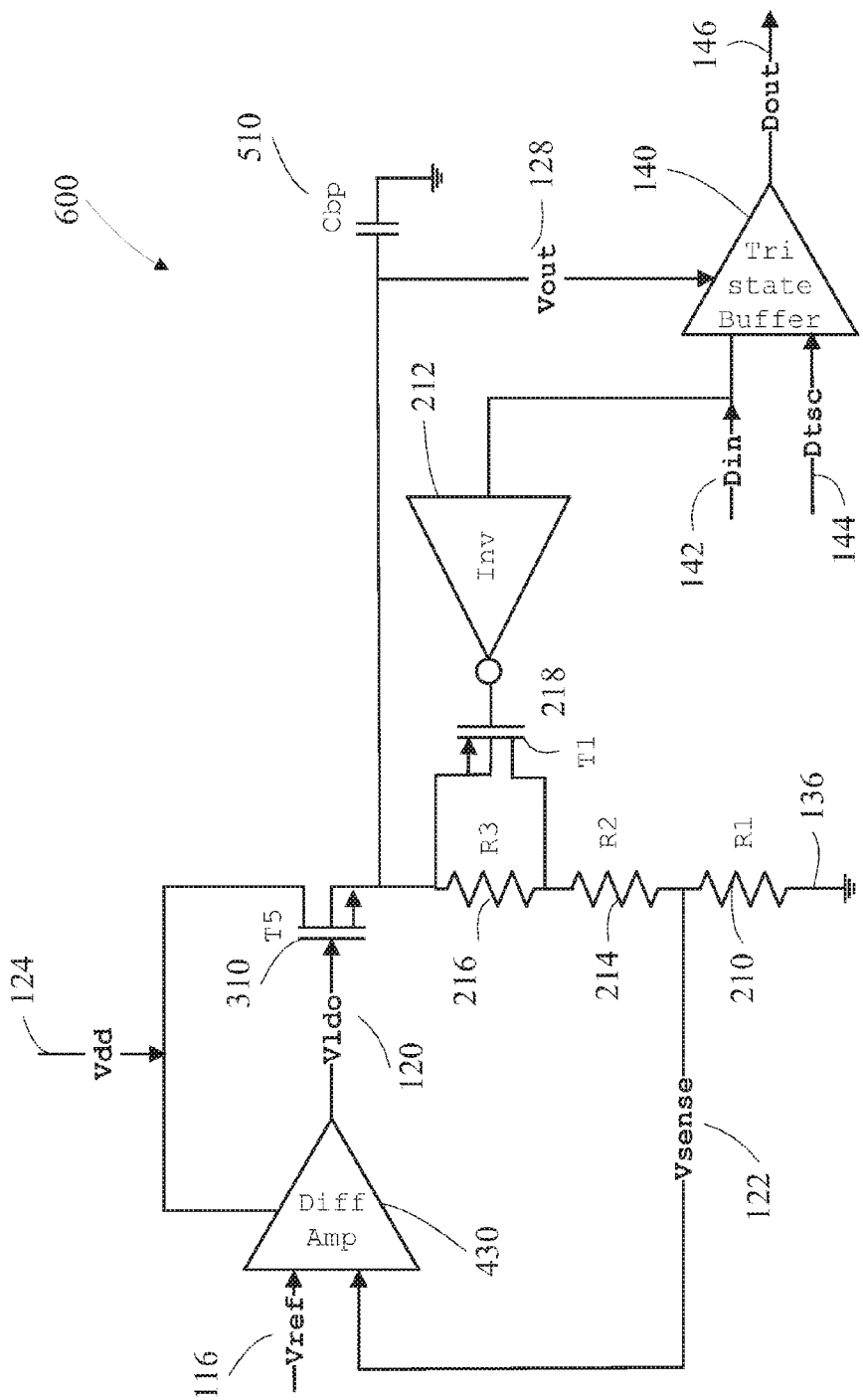
FIG. 6 is a dual voltage supply utilizing transistors and buffer in accordance with one embodiment of the disclosure.

FIG. 6 depicts an example of the system in which a first resistor (R1) 210, a second resistor (R2) 214 in series connection with the first resistor (R1) 210 and a third resistor (R3) 216 in series connection to the second resistor (R2) 214. At the junction of the first resistor (R1) 210 and R2 (214) a voltage divided output voltage where the sense voltage (Vsense) 122 is tapped.

A differential amplifier 430 receives two signals, the voltage divided output voltage where the sense voltage (Vsense) 122 and a reference voltage 116 (Vref) and outputs a low voltage dropout signal 120 (Vldo).

A power gating transistor 310 (T5) has a drain of the power gating transistor is coupled to power source 124 (Vdd) and has a source outputting the output voltage 128 (Vout). The gate of the power gating transistor is configured to receive the low voltage dropout signal (Vldo) 120 from the differential amplifier.

An inverter 212 has an output coupled to the gate of the pull up transistor (T1) 218. In this example, T1 acts as a switch. The inverter power input is derived from the output voltage signal (Vout) 128 and the pre-charge capacitor 110 (Cbp), and has as an input the logic state input voltage 142 (Din). The inverter 212 may be replaced with a buffer or the like. The pull up transistor (T1) 218 may be either n-type or p-type depending upon the preference of those skilled in the art. Depending upon the device type and circuit layout the power gating transistor and the pull up transistor sources and drains may be interchangeable and the inverter may be removed from the circuit.

Pull up switch (T1) 218 acts as a bridge across resistor (R3) 216 which changes the apparent resistance, current flow and thus voltage output at Vsense 122, which effects the differential amplifier, which in turn effects Vldo to cause a change in the output voltage Vout 128 driven by the power gating transistor (T5).

The gate of (T1) 218 is driven by the output of inverter 212, the input of inverter 212 is configured to receive a logic state input voltage (Din) 142.

A digital output buffer 140 has an input configured to receive a logic state input voltage (Din) 142 indicating the upcoming state of the data. The digital output buffer 140 power input is the output voltage signal (Vout) 128 and the digital output buffer outputs a digital output signal 146 (Dout). In this example the power input is coupled to a capacitor (Cbp) 510 which is coupled to ground.

The power gating transistor 310 (T5) in this example may be replaced by a PMOS low voltage dropout transistor or the like.

Figure 7:
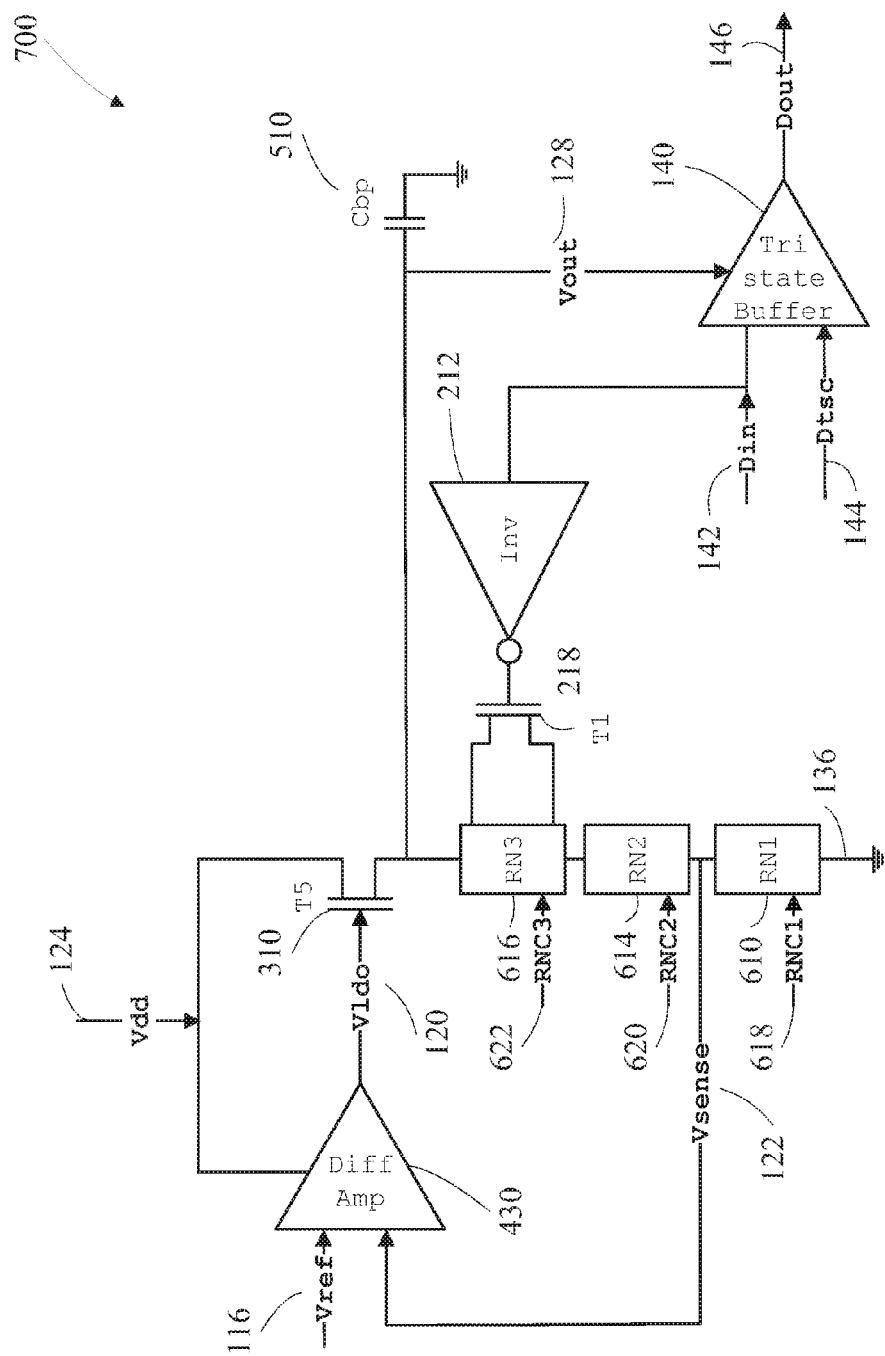
FIG. 7 is a dual voltage supply utilizing a programmable resistor network in accordance with one embodiment of the disclosure.
Figure 8A:
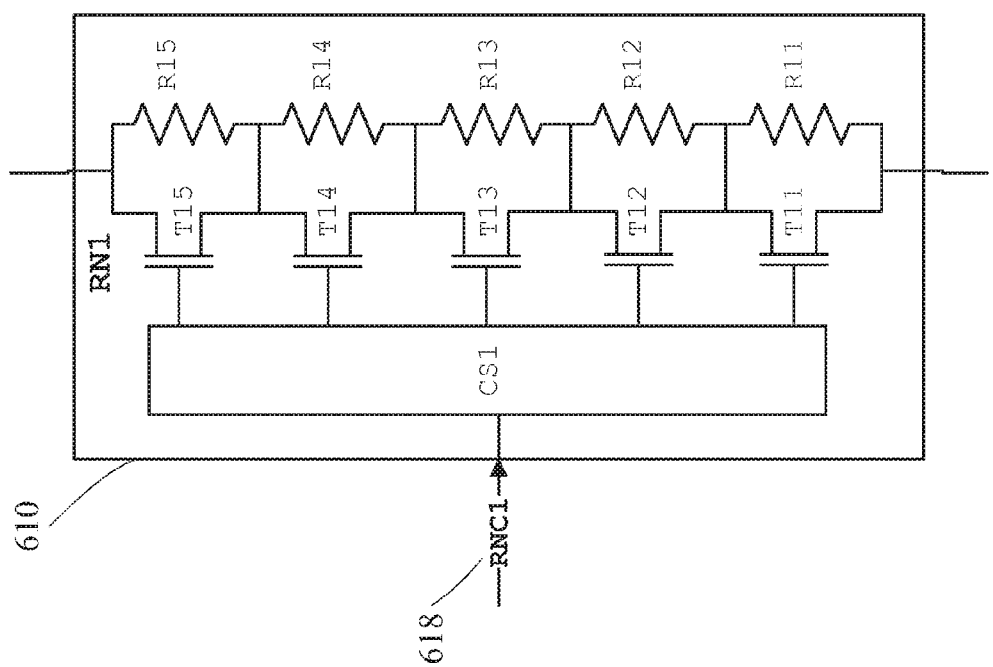
FIG. 8A is a first series resistor network in accordance with one embodiment of the disclosure.
Figure 8B:
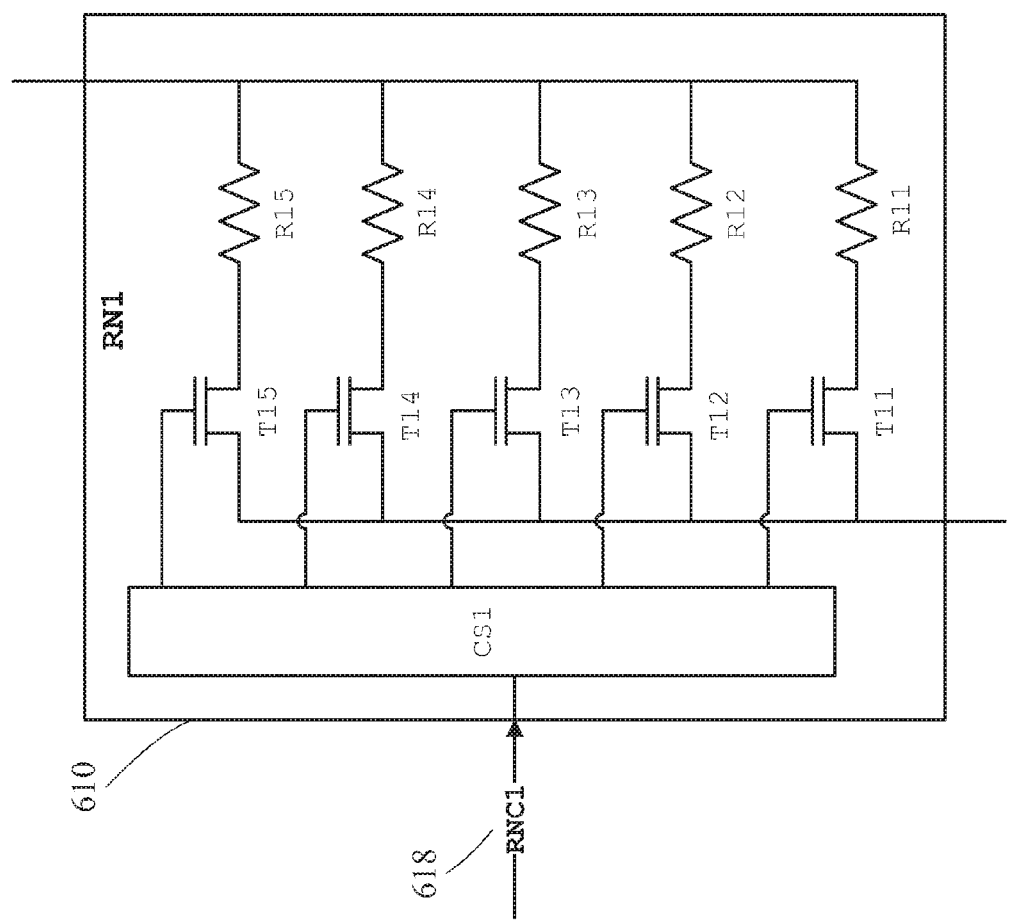
FIG. 8B is a first parallel resistor network in accordance with one embodiment of the disclosure.

FIG. 7 is a modification of the example of FIG. 6 in which the individual resistors R1 210/R2 214/R3 216 are replaced by programmable resistor networks RN1 610/RN2 614/RN3 616. The first resistor network 610 (RN1) has a first control signal input 618 (RNC1) and is seen in greater detail in FIG. 8A, where the first control signal input 618 is fed into a control section CS1 in which either individual or multiple resistors may be chosen from the string given by R11-R15 selectable individually by transistors T11-T15. FIG. 8B shows an alternative topology, in which the resistors are connected in parallel with series connected switches selecting the specific resistor or resistors in the network. The second 614 and third resistor networks 616 operate in a similar fashion in which their control signals RNC2 and RNC3 control transistors which in turn select either a single or multiple resistors. It is also possible to simplify the example shown by FIG. 7 by removing RN3 616, T1 218 and INV 212. Changing the resistor divider ratio between Vout and GND sets Vsense and programmable resistor networks RN1 610 and RN2 614 may be utilized to accomplish this. Additionally, one programmable resistor network may provide the requisite resistor divider ratio, and this is shown in FIG. 6 where R2, R3 and T1 form that one network. It is also contemplated that the resistor network above Vsense, below Vsense, or above and below Vsense may be programmable.

Figure 9A:
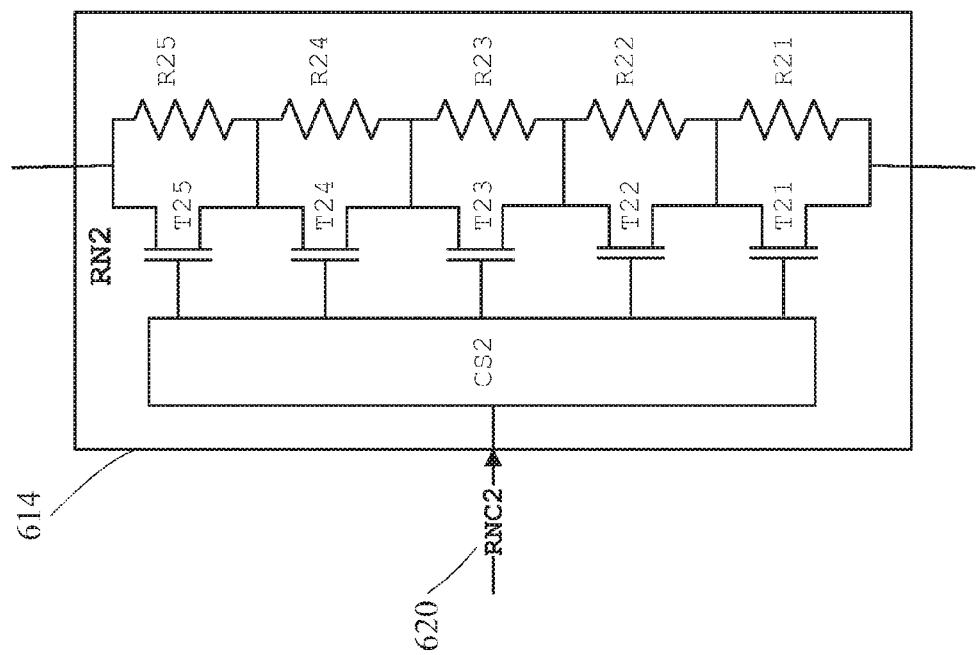
FIG. 9A is a second series resistor network in accordance with one embodiment of the disclosure.
Figure 10A:
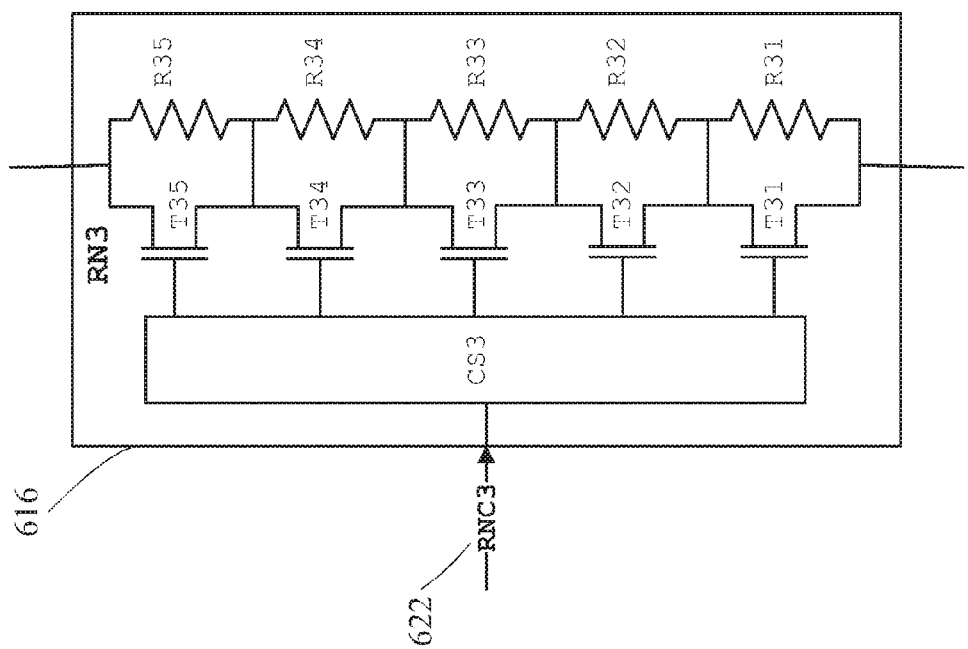
FIG. 10A is a third series resistor network in accordance with one embodiment of the disclosure.

FIGS. 9A and 10A show the resistor networks in which the resistors are connected in series and the switches are connected in parallel across each resistor. In this way individual or multiple resistors may be added together depending upon the switch selected.

Figure 9B:
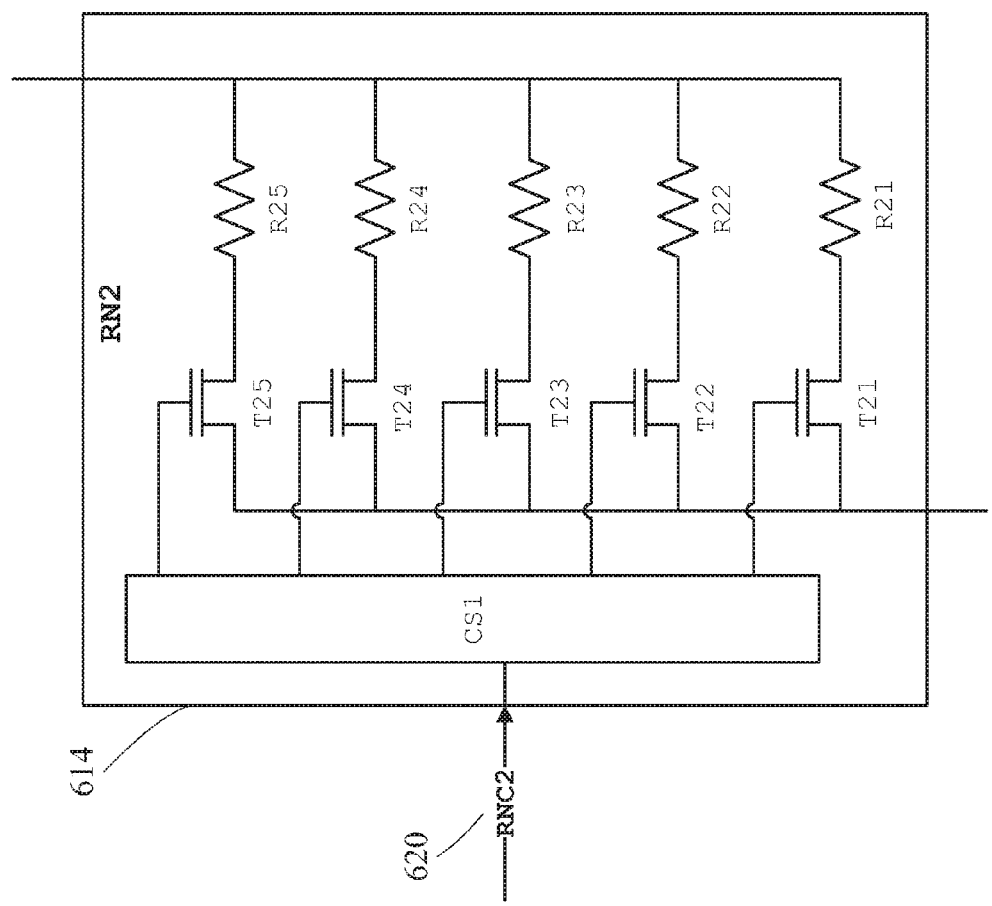
FIG. 9B is a second parallel resistor network in accordance with one embodiment of the disclosure.
Figure 10B:
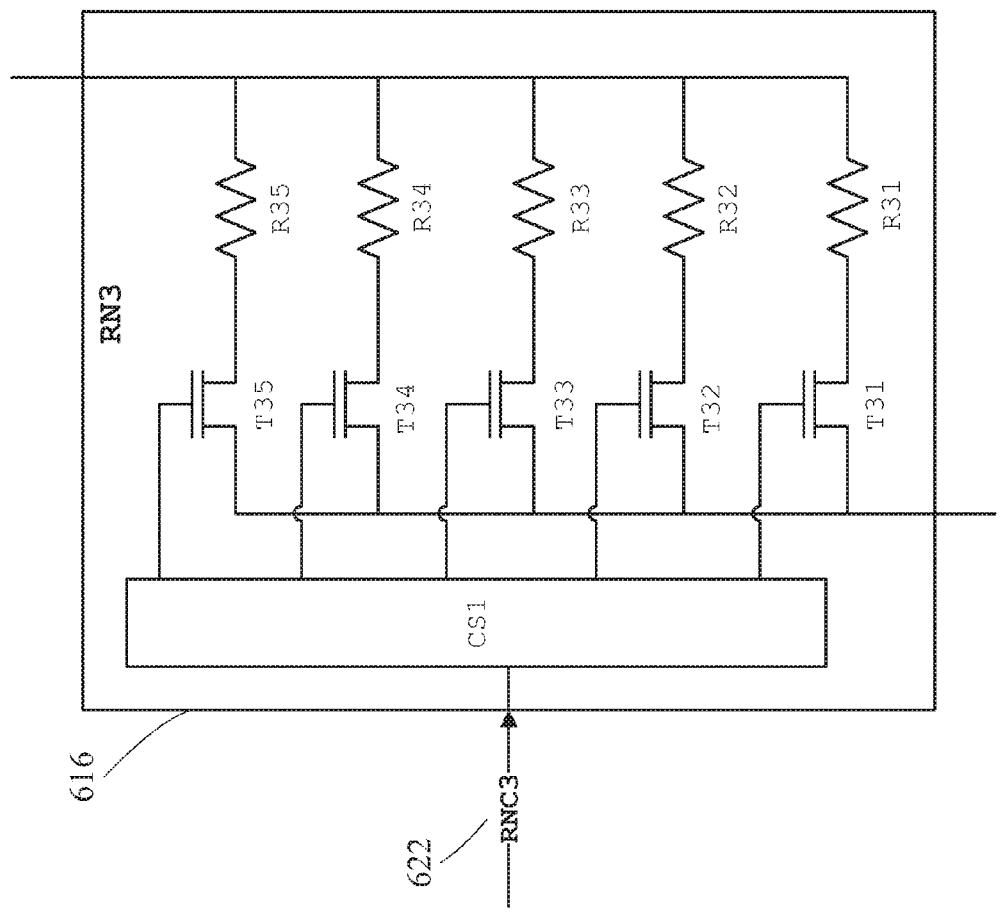
FIG. 10B is a third parallel resistor network in accordance with one embodiment of the disclosure.

FIGS. 9B and 10B show alternatives to FIGS. 9A/10A. In these networks the resistors are connected in parallel and the switches controlling the individual resistors are connected in series to the individual resistors. In this way the resistors may be individually selected or added in parallel. Another embodiment of the resistor network could include both the alternatives of 8A/9A or 10A with 8B/9B or 10B.

Figure 11:
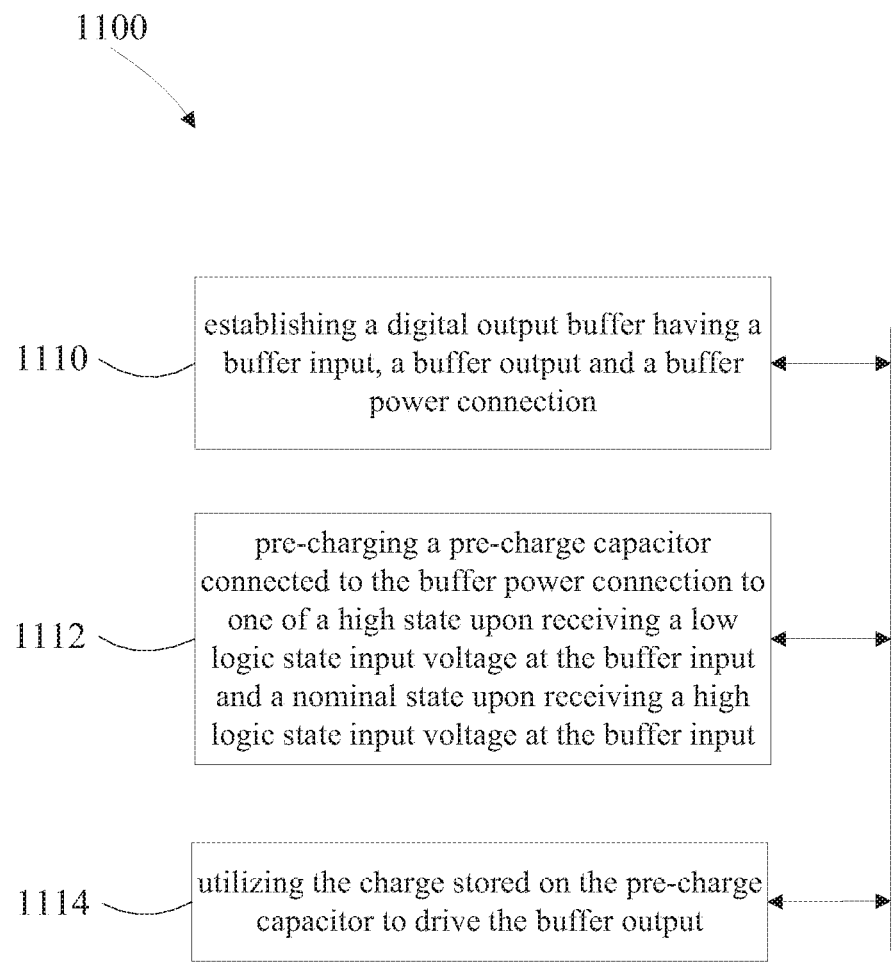
FIG. 11 is a method of implementation of a dual voltage supply in accordance with one embodiment of the disclosure.

An example method of FIG. 11 comprises establishing 1110 a digital output buffer having a buffer input, a buffer output and a buffer power connection, pre-charging 1112 a pre-charge capacitor coupled to the buffer power connection to one of a high state upon receiving a low logic state input voltage at the buffer input and a nominal state upon receiving a high logic state input voltage at the buffer input and utilizing 1114 the charge stored on the pre-charge capacitor to drive the buffer output.

Figure 12:
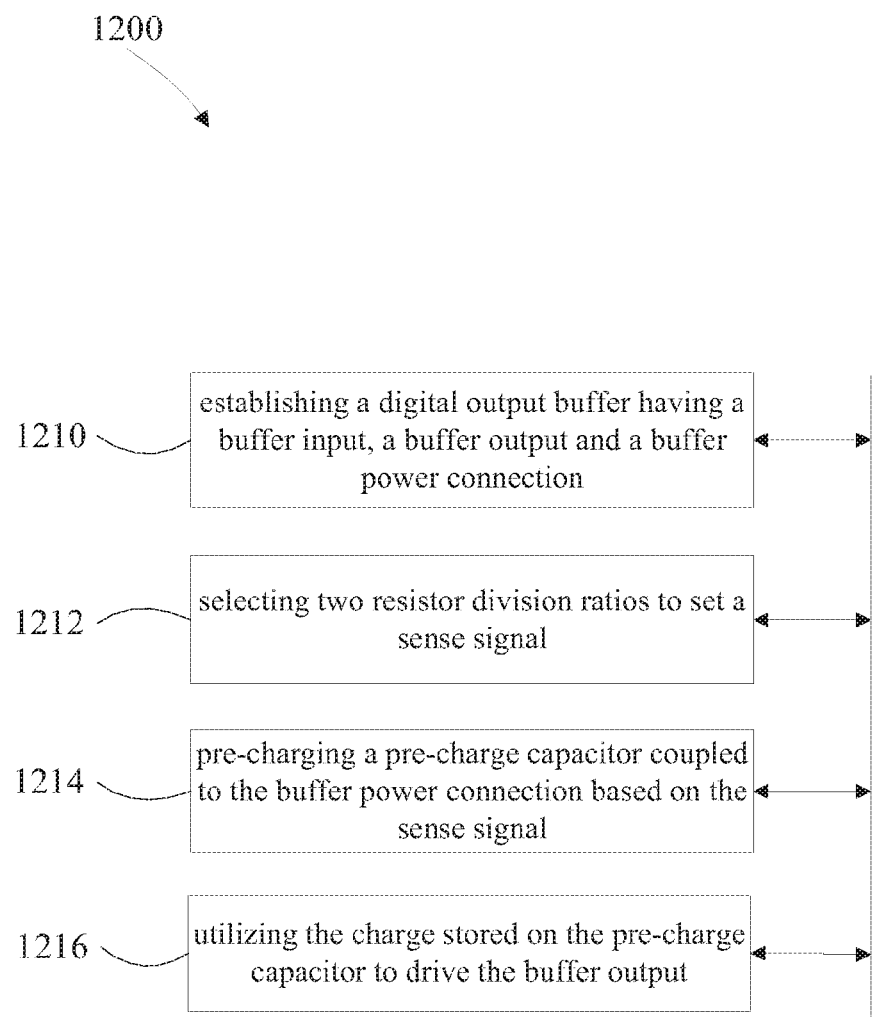
FIG. 12 is a method of implementation of a dual voltage supply utilizing programmable resistor networks in accordance with one embodiment of the disclosure.

An example method of FIG. 12 utilizes resistor network programming to adjust the power supply. In this example a method comprising establishing a digital output buffer having a buffer input, a buffer output and a buffer power connection, selecting two resistor division ratios to set a sense signal, pre-charging a pre-charge capacitor coupled to the buffer power connection based on the sense signal and utilizing the charge stored on the pre-charge capacitor to drive the buffer output.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A system, comprising:
   a dual voltage supply configured to receive a logic state input voltage and configured to output an output voltage, wherein the dual voltage supply is configured to output a nominal voltage at a high state of the logic state input voltage and the dual voltage supply is configured to output a high voltage at a low state of the logic state input voltage;
   a pre-charge capacitor configured to receive the output voltage of the dual voltage supply; and
   an output buffer has an output buffer power input coupled to the pre-charge capacitor and configured to receive the output voltage of the dual voltage supply, an output buffer signal input configured to receive the logic state input voltage and an output buffer output configured to output a digital output signal.

2. The system of claim 1, wherein the output buffer is a tristate buffer configured to also receive a tristate control signal.

3. The system of claim 1, wherein the dual voltage supply comprises:
   an inverter has an inverter input configured to receive the logic state input voltage;
   a nominal switch has a nominal switch actuator coupled the inverter input, a nominal switch first pole is configured to receive the nominal voltage;
   a high switch has a high switch actuator coupled to an inverter output of the inverter, a high switch first pole is configured to receive the high voltage, a high switch second pole is coupled to a nominal switch second pole; and
   wherein the output buffer has the output buffer power input coupled to the high switch second pole.

4. The system of claim 3, wherein the nominal switch comprises a transistor.

5. The system of claim 3, wherein the high switch comprises a transistor.

6. The system of claim 1, wherein the dual voltage supply comprises:
   an input buffer configured to receive the logic state input voltage;
   a nominal transistor has a nominal transistor gate coupled to an output of the input buffer, a nominal transistor drain configured to receive the nominal voltage;
   an inverter has an inverter input coupled to the output of the input buffer;
   a high transistor has a high transistor gate coupled to an inverter output of the inverter, a high transistor drain configured to receive the high voltage, a high transistor source coupled to a nominal transistor source of the nominal transistor; and
   wherein the output buffer has the output buffer power input coupled to the nominal transistor drain of the nominal transistor.

7. The system of claim 6, wherein the nominal transistor is n-type.

8. The system of claim 6, wherein the nominal transistor is p-type.

9. The system of claim 6, wherein the high transistor is n-type.

10. The system of claim 6, wherein the high transistor is p-type.

11. A system comprising:
  at least three voltage dividing resistors coupled in series;
  a voltage divider switch coupled across at least one of the at least three voltage dividing resistors, said voltage divider switch configured to receive a logic state input voltage;
  a differential amplifier has a first differential amplifier input coupled to at least one of the at least three voltage dividing resistor and a second differential amplifier input configured to receive a reference voltage;
  a power gating transistor has a power gating gate coupled to a differential amplifier output of the differential amplifier, a power gating drain configured to be coupled to a power source and a power gating source coupled to one of the at least three voltage dividing resistors;
  a pre-charge capacitor coupled to the power gating source of the power gating transistor; and
  an output buffer configured to receive power from the source of the power gating transistor and the pre-charge capacitor, an output buffer signal input configured to receive the logic state input voltage and an output buffer signal output configured to output a digital output signal.

12. The system of claim 11, wherein the output buffer is a tristate buffer configured to also receive a tristate control signal.

13. The system of claim 11, wherein the at least three voltage dividing resistors comprise resistor networks having selectable resistors.

14. The system of claim 11, wherein the power gating transistor is n-type.

15. The system of claim 11, wherein the power gating transistor is p-type.

16. The system of claim 11, wherein the voltage divider switch comprises a transistor.

17. A system comprising:
  at least one third resistor;
  a power gating transistor has a power gating drain configured to be coupled to a power source and a power gating source coupled to the at least one third resistor;
  a pull up transistor has a pull up gate configured to receive a logic state input voltage, a pull up source coupled to a first end of the at least one third resistor;
  a differential amplifier has a first input coupled to a reference voltage and a differential amplifier output coupled to a power gating gate of the power gating transistor; and
  an output buffer has an input buffer power input configured to receive the output voltage, an output buffer signal input configured to receive the logic state input voltage and an output buffer signal output configured to output a digital output signal.

18. The system of claim 17, wherein the at least one third resistor comprises a third resistor network having a plurality of series coupled third resistors and a plurality of third switches coupled in parallel with the third resistors selecting designated ones of the plurality of third resistors.

19. The system of claim 17, wherein the at least one third resistor comprises a third resistor network having a plurality of parallel coupled third resistors and a plurality of third switches coupled in series with the third resistors selecting designated ones of the plurality of third resistors.

20. The system of claim 17 wherein the output buffer is a tristate buffer has a second output buffer signal input configured to receive a tristate control signal.

21. The system of claim 17, further comprising a pre-charge capacitor coupled to the power gating source of the power gating transistor.

22. The system of claim 17 further comprising:
  at least one first resistor;
  at least one second resistor in series connection to the at least one first resistor and the at least one second resistor in series connection to the at least one third resistor;
  a pull up drain of the pull up transistor coupled to a junction of the at least one second resistor and the at least one third resistor;
  a second input of the differential amplifier coupled to a juncture of the at least one first resistor and the at least one second resistor; and
  a pre-charge capacitor configured to receive the output voltage and coupled to the output buffer power input.

23. The system of claim 22, wherein the at least one third resistor comprises a third resistor network having a plurality of series coupled third resistors and a plurality of third switches coupled in parallel across the third resistors selecting designated ones of the plurality of third resistors.

24. The system of claim 22, wherein the at least one third resistor comprises a third resistor network having a plurality of parallel coupled third resistors and a plurality of third switches coupled in series to the third resistors selecting designated ones of the plurality of third resistors.

25. The system of claim 22, wherein the at least one first resistor comprises a first resistor network having a plurality of series coupled first resistors and a plurality of first switches coupled in parallel across the first resistors selecting designated ones of the plurality of first resistors.

26. The system of claim 22, wherein the at least one first resistor comprises a first resistor network having a plurality of parallel coupled first resistors and a plurality of first switches coupled in series to the first resistors selecting designated ones of the plurality of first resistors.

27. The system of claim 22, wherein the at least one second resistor comprises a second resistor network having a plurality of series coupled second resistors and a plurality of second switches coupled in parallel across the second resistors selecting designated ones of the plurality of second resistors.

28. The system of claim 22, wherein the at least one second resistor comprises a second resistor network having a plurality of parallel coupled second resistors and a plurality of second switches coupled in series to the second resistors selecting designated ones of the plurality of second resistors.

29. A method comprising:
  a) establishing a digital output buffer having a buffer input, a buffer output and a buffer power connection;
  b) pre-charging a pre-charge capacitor coupled to the buffer power connection to one of a high state upon receiving a low logic state input voltage at the buffer input and a nominal state upon receiving a high logic state input voltage at the buffer input; and
  c) utilizing the charge stored on the pre-charge capacitor to drive the buffer output.

30. A method comprising:
  a) establishing a digital output buffer having a buffer input, a buffer output and a buffer power connection;

b) selecting two resistor division ratios to set a sense signal;
c) pre-charging a pre-charge capacitor coupled to the buffer power connection based on the sense signal; and
d) utilizing the charge stored on the pre-charge capacitor to drive the buffer output.

* * * * *